United States Patent [19]
Koyama

[11] 4,318,740
[45] Mar. 9, 1982

[54] LOW ALLOY LEAD FRAME

[75] Inventor: Tomoyuki Koyama, Hamamatsu, Japan

[73] Assignee: Nippon Gakki Seizo Kabushiki Kaisha, Japan

[21] Appl. No.: 116,644

[22] Filed: Jan. 29, 1980

[30] Foreign Application Priority Data

Jan. 31, 1979 [JP] Japan .................. 54-009181

[51] Int. Cl.³ .............. C22C 38/02; C22C 38/04; C22C 38/08; C22C 38/20
[52] U.S. Cl. .................. 75/125; 75/128 P; 75/128 T; 174/52 FP; 428/620; 428/672; 428/673
[58] Field of Search ............ 75/123 D, 125, 126 K, 75/128 P, 128 T; 428/596, 597, 620, 672, 673; 357/70; 174/52 FP; 148/36

[56] References Cited

U.S. PATENT DOCUMENTS

| | | | |
|---|---|---|---|
| 1,959,398 | 5/1934 | Whitely | 75/125 |
| 2,280,796 | 4/1942 | Comstock | 148/36 |
| 2,901,346 | 8/1959 | Huddle et al. | 75/123 C |
| 3,574,602 | 4/1971 | Gondo et al. | 75/128 T |
| 3,711,340 | 1/1973 | Korchynsky et al. | 148/36 |
| 3,950,140 | 4/1976 | Bliven et al. | 428/596 |
| 4,065,625 | 12/1977 | Iwai et al. | 428/620 |
| 4,141,029 | 2/1979 | Dromsky | 428/596 |
| 4,266,974 | 5/1981 | Nitta et al. | 75/125 |

OTHER PUBLICATIONS

*Phosphorous-Iron Alloys Bulletin No. 2*, Monsanto Chemicals, pp. 2, 37, 41 (1940).

Primary Examiner—Michael L. Lewis
Attorney, Agent, or Firm—Ostrolenk, Faber, Gerb & Soffen

[57] ABSTRACT

Lead frame of sufficient mechanical strength, lowered cost, excellent plating affinity and enhanced anticorrosion is obtained through increased contents of P and Cu and remarkably reduced content of Ni or Cr even without employment of the preparative Ni strike plating necessitated in the prior art.

6 Claims, 2 Drawing Figures

LOW ALLOY LEAD FRAME

BACKGROUND OF THE INVENTION

The present invention relates to improved lead frame, and more particularly relates to lead frame having an improved composition and well suited for use for IC elements and transistors.

Conventionally, Fe-Ni alloys or Fe-Ni-Co alloys are in general known as the material for such lead frames. As one of the Fe-Ni-Co alloys used for this purpose, the alloy "F-15" of ASTM is known which roughly contains 54% by weight of Fe, 29% by weight of Ni and 17% by weight of Co. As another of the Fe-Ni alloys used for this purpose, the alloy "F-30" of ASTM is known which contains about 42% by weight of Ni.

However, the relatively high content of costly Ni and Co in these alloys has the disadvantage of high material cost. In addition, these alloys are unsuited for the silver plating which is to be carried out in manufacturing of lead frames. In order to eliminate this difficulty in silver plating, Ni plating has to be applied to the object as a pre-treatment for the silver plating by the so-called strike plating methods, i.e. plating with high electric current density for a short period. Such a double staged plating process naturally causes a rise in manufacturing cost of lead frames.

Copper or copper alloys are also used for manufacturing of lead frames. These copper materials, however, are in general inferior to the above-described Fe-Ni alloys and Fe-Ni-Co alloys in mechanical strength. Such lower mechanical strength of the alloys tends to form a bar to smooth and trouble-free mounting of complete IC elements to printed circuit base boards. In such mounting, a lead or leads of each IC element are forcedly inserted into associated apertures in a printed circuit base board by means of an automatic machine. Consequently, low mechanical strength of the material alloy tends to cause undesirable buckling of the leads and/or unsuccessful insertion of the leads.

Low-carbon steel is known as a material which is cheaper than Fe-Ni alloys and Fe-Ni-Co alloys but provided with appreciably high mechanical strength. Therefore, it is within consideration to use low-carbon steel for manufacturing of lead frames. However, the conventional low-carbon steels are in general very low in anticorrosion property and, consequently, quite unsuited for use in manufacturing of lead frames. In manufacturing of lead frames, an elongated material plate is shaped into a corrugated form by a press and silver plating is applied to the surface of the corrugated form. After connection to a chip of each IC element, packaging is carried out to form respective IC elements. Finally, cutting is effected on the lead frames. Apparently, the cut ends of the lead frames are not plated with silver. Thus, when a low anti-corrosion material is used for the material plate, stain is liable to start at the cut ends of the lead frames. Further, when the corrugated material plate is left untreated before the silver plating, development of stain on the surface of the plate tends to hinder ideal plating of the surface. For these reasons, it is quite unfeasible to use low-carbon steel for manufacturing of lead frames.

SUMMARY OF THE INVENTION

It is one object of the present invention to provide a lead frame having appreciable mechanical strength but by far cheaper than the conventional lead frames made of Fe-Ni alloys or Fe-Ni-Co alloys.

It is another object of the present invention to provide a lead frame of sufficiently high anticorrosion.

In accordance with the present invention, the lead frame contains 0.08 to 3.40% by weight of at least one component chosen from a group consisting of 0.30 to 1.50% by weight of Cr, 0.20 to 1.0% by weight of Ni, 0.15 to 0.75% by weight of Si and 0.08 to 0.15% by weight of Ti; 0.05 to 0.60% by weight of P; 0.04 to 0.70% by weight of Cu; up to 0.19% by weight of C; and remaining percent of Fe.

DESCRIPTION OF THE PREFERRED EMBODIMENTS

In the case of the lead frame in accordance with the present invention, the content of C has to be 0.19% or smaller. When the content of C exceeds this limit, manufacturing of lead frames is seriously hindered and the tenacity of the products is lowered to prevent smooth connection of leads.

Addition of P in combination with Cu has a multiplied effect on improvement of anticorrosion. When their content falls short of 0.05% by weight for P and 0.04% by weight for Cu, respectively, no noticeable effect on anticorrosion is obtained. No further rise in anticorrosion can be expected for if their contents exceed 0.60% by weight for P and 0.70% by weight for Cu, respectively.

Addition of Cr, Ni, Si and Ti well contributes to improvement in anticorrosion also. The addition may contain either one or two or more of these components. In any case, no noticeable effect on anticorrosion is obtained when the content of Cr is smaller than 0.30% by weight, the content of Ni is smaller than 0.20% by weight, the content of Si is smaller than 0.15%, or the content of Ti is smaller than 0.08%. The anticorrosion required for lead frames can be satisfied by contents up to 1.5% by weight for Cr, 1.0% by weight for Ni, 0.75% by weight for Si and 0.15% by weight for Ti, and the addition of these materials exceeding these upper limits only lead to higher costs for the materials. Further, addition of Cr, Ni, Si and Ti assures high tenacity of the products and smooth and trouble-free manufacturing of the lead frames.

Figure 1:
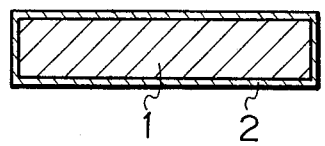
FIG. 1 is a transverse cross sectional view of one embodiment of the lead frame in accordance with the present invention.

In manufacturing of the lead frames in accordance with the present invention, an elongated material plate is shaped into a corrugated form and gold or silver plating is applied to the surface of the corrugated form. One embodiment of the lead frame manufactured in this way is shown in FIG. 1, in which the material substratum 1 of the above-described composition is covered with a thin plate layer 2. As the material of the above-described composition is well receptive of the gold or silver plate layer, there is no need at all for the preparative strike plating which has to be employed in the conventional art using Fe-Ni alloys and Fe-Ni-Co alloys.

DESCRIPTION OF EXAMPLES

Materials of examples 1 through 17 having compositions enumerated in Table 1 were prepared by adding prescribed contents of P, Cu, Ni, Cr, Si, and Ti to low-carbon steel available on market and elongated material test plates for lead frames of 0.254 mm. thickness were formed of the materials by in a roll press.

For comparison, conventional material test plates for lead frames were formed also of Fe-Ni alloy (alloy 42, the conventional example A in the table) and of ordinary low-carbon steel (the conventional examples B and C in the table), respectively. For same purpose, examples D through H were also prepared in which contents of the components fall out of the scope of the present invention.

preparative Ni strike plating assures a good result in the final plating regardless of difference in material.

In the case of the plating test II, Ag plating of 3 microns thickness was directly applied to each material test plate without the preparative Ni strike plating. Heating was carried out under the same conditions as the plating test II and the surface condition was observed before and after the heating.

As shown in the table, development of a number of small bulges was noticed on the surface of the test plate made of Fe-Ni alloy (comparative example A). Neither trouble nor bulge was noticed in the case of the other examples. In the case of the comparative example A, the diameter of the bulges was in a range from several ten to several hundred microns. The number of the bulges was 20 to 25 over the entire surface area (400 mm$^2$) of the

TABLE 1

| Example | | C | P | Cu | Cr | Ni | Si | Ti | Mn | S | Fe |
|---|---|---|---|---|---|---|---|---|---|---|---|
| Example | 1 | 0.08 | 0.13 | 0.59 | 0.67 | — | — | — | — | — | Remnant |
| of the | 2 | 0.11 | 0.13 | 0.51 | — | 0.46 | — | — | — | — | |
| invention | 3 | 0.08 | 0.14 | 0.57 | — | — | 0.52 | — | — | — | |
| | 4 | 0.08 | 0.11 | 0.62 | — | — | — | 0.14 | — | — | |
| | 5 | 0.08 | 0.10 | 0.63 | 0.89 | 0.49 | — | — | — | — | |
| | 6 | 0.09 | 0.14 | 0.51 | 0.92 | — | 0.71 | — | — | — | |
| | 7 | 0.11 | 0.21 | 0.67 | 0.44 | — | — | 0.14 | — | — | |
| | 8 | 0.07 | 0.12 | 0.35 | — | 0.81 | 0.55 | — | — | — | |
| | 9 | 0.10 | 0.12 | 0.38 | — | 0.53 | — | 0.11 | — | — | |
| | 10 | 0.08 | 0.13 | 0.53 | — | — | 0.68 | 0.10 | — | — | |
| | 11 | 0.10 | 0.27 | 0.46 | 0.50 | 0.77 | 0.54 | — | — | — | |
| | 12 | 0.10 | 0.26 | 0.48 | 0.56 | — | 0.47 | 0.11 | — | — | |
| | 13 | 0.08 | 0.11 | 0.61 | — | 0.39 | 0.42 | 0.14 | — | — | |
| | 14 | 0.11 | 0.21 | 0.67 | 0.91 | 0.83 | — | 0.14 | — | — | |
| | 15 | 0.10 | 0.17 | 0.55 | 1.01 | 0.57 | 0.35 | 0.10 | — | — | |
| | 16 | 0.09 | 0.06 | 0.09 | 0.32 | 0.27 | 0.19 | 0.10 | — | — | |
| | 17 | 0.08 | 0.59 | 0.67 | 1.42 | 0.90 | 0.71 | 0.15 | — | — | |
| Com- | A | 0.06 | 0.0002 | 0.03 | 0.03 | 41.08 | 0.17 | — | 0.53 | 0.0002 | Remnant |
| parative | B | 0.10 | — | — | — | — | — | — | — | — | |
| example | C | 0.09 | — | — | — | — | — | — | — | — | |
| | D | 0.10 | 0.03 | 0.03 | 0.27 | 0.18 | 0.12 | 0.04 | — | — | |
| | E | 0.08 | 0.82 | 0.81 | 2.0 | 2.7 | 1.5 | 0.40 | — | — | |
| | F | 0.10 | — | — | 0.33 | 0.22 | 0.19 | 0.11 | — | — | |
| | G | 0.07 | 0.08 | — | 0.40 | 0.27 | 0.19 | 0.10 | — | — | |
| | H | 0.08 | — | — | 0.05 | 0.32 | 0.25 | 0.16 | 0.13 | — | — |

TABLE 2

| | | Example of the invention 1-17 | Comparative example | | |
|---|---|---|---|---|---|
| | | | A | B,C | D-H |
| Plating Test I | Before heating | No trouble | No trouble | No trouble | No trouble |
| | After heating | No trouble | No trouble | No trouble | No trouble |
| Plating test II | | No trouble | Bulge | No trouble | No trouble |
| Wire bonding test (tensile strength) | | above 3g. | Bulge below 0.1g No bulge above 3g | above 3g. | above 3g. |
| Weather test I | | No trouble | No trouble | spot stain | No trouble |

In the case of the plating test I, Ni plating of 0.5 microns thickness was applied to each material test plate by the strike plating method and, thereafter, Ag plating of 3 microns thickness was applied to the pretreated test plate. Next, heating was carried out at 500° C. for 2 minutes. The resultant surface condition of the test plate was observed before and after the heating. As shown in Table 2, no trouble was noticed on any of the test plates. This result indicates that employment of the test plate. Development of such bulges are caused by generation of air voids which resulted from poor adherence of the plated layer to the surface of the material plate. At bulging sections, the plated layer is very poor in mechanical strength, which easily leads to development of cracks and separation of the plated layer. Consequently, it is not preferable to bond the gold wire on the inner bond side of an IC element to such a bulging section by a heat press. Thus, it is clear that use of the conventional alloy 42 for the material necessitates employment of the preparative Ni strike plating. This is proved by the result of the wire bonding test also.

In the case of the wire bonding test, an Au wire of 25 microns diameter was bonded to the surface of each test plate, which had been subjected to direct Ag plating, by heat press carried out at 360° C. for a period of 1 second or shorter and the Au wire was subjected to tension in order to measure the breaking strength. In the case of the test plate of the comparative example A (Fe-Ni alloy), bonding of the Au wire was applied to both the bulging and flat sections. As a result, it was confirmed that, except for the bulging section on the test plate of the comparative example A, the bonding strengths of the test plates of the other examples were all above 3 grams which is the value required for use in IC elements.

In the case of the weather test I, each material test plate without plating was left for 10 days in a test room and the change in surface condition was observed. As shown in the table, small spot stains were generated on the test plates made of low-carbon steel (the comparative examples B and C), which tend to hinder smooth adherence of the plated layer. No stain was noticed on the test plate of the comparative example A. The period of 10 days correspond to the standard period in which the material plates are in general left prior to plating in manufacturing of lead frames. That is, the material plates made of low-carbon steel are quite unsuited for use in manufacturing of lead frames.

Figure 2:
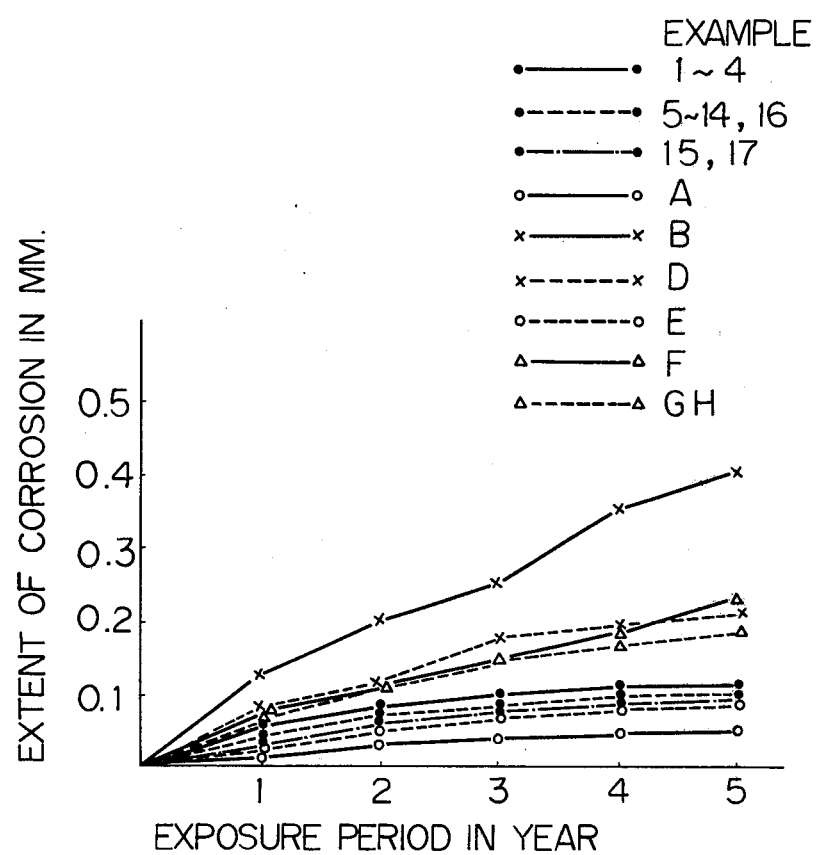
FIG. 2 is a graph for showing results of the examples of the present invention.

Likewise, each material test plate without plating was left outdoors for an appreciably long period in order to measure the extent of corrosion, the result being graphically shown in FIG. 2. In the drawing, the extent of corrosion in mm. is taken on the ordinate and the length of the exposure period in year is taken on the abseissa. This result clearly indicates that the lead frames of the invention are very excellent in the weather resistance.

In accordance with the present invention, the lead wires are provided with high bonding strength even without employment of the Ni strike plating process which the prior art necessitates. This results in a simplified manufacturing of lead frames, thereby remarkably cutting down the manufacturing cost. In addition, the relatively low content of costy materials such as Ni or Cr results in remarkably lowered material cost in manufacturing of lead frames, when compared with the conventional lead frames made of Fe-Ni alloys or Fe-Ni-Co alloys. High weather resistance assures successfully plating with almost no generation of stain. No lowering in mechanical strength enables smooth mounting of leads to printed circuit base boards.

I claim:
1. An improved lead frame containing 0.30 to 1.50% by weight for Cr; 0.20 to 1.0% by weight for Ni; 0.15 to 0.75% by weight for Si; 0.08 to 0.15% by weight for Ti; 0.05 to 0.60% by weight of P; 0.04 to 0.70% by weight of Cu; up to 0.19% by weight of C; and the balance Fe.

2. The improved lead frame of claim 1 in which the amount of chromium is 0.32–1.42% by weight, the amount of nickel is 0.27–0.9% by weight, the amount of silicon is 0.19–0.71% by weight and the amount of titanium is 0.10–0.15% by weight.

3. The improved lead frame of claim 2 in which the amount of phosphorus is 0.06–0.59% by weight, the amount of copper is 0.09–0.67% by weight, and the amount of carbon is 0.08–0.1% by weight.

4. The improved lead frame of claim 3 in which the chromium is 1.01 weight percent, the amount of nickel is 0.57 weight percent, the amount of silicon is 0.35 weight percent and the amount of titanium is 0.10 weight percent.

5. The improved lead frame of claim 3 in which the chromium is 0.32 weight percent, the nickel is 0.27 weight percent, the silicon is 0.19 weight percent and the titanium is 0.10 weight percent.

6. The improved lead frame of claim 3 in which the chromium is 1.42 weight percent, the nickel is 0.90 weight percent, the silicon is 0.71 weight percent and the titanium is 0.15 weight percent.

* * * * *